United States Patent [19]

Elkind et al.

[11] Patent Number: 5,485,199
[45] Date of Patent: Jan. 16, 1996

[54] DIGITAL AUDIO WAVEFORM DISPLAY ON A VIDEO WAVEFORM DISPLAY INSTRUMENT

[75] Inventors: Bob Elkind, Gaston; Gilbert A. Hoffman, Aloha, both of Oreg.

[73] Assignee: Tektronix, Inc., Wilsonville, Oreg.

[21] Appl. No.: 277,054

[22] Filed: Jul. 19, 1994

[51] Int. Cl.⁶ .................................................. H04N 17/04
[52] U.S. Cl. .......................................... 348/180; 348/564
[58] Field of Search ........................... 348/185, 180, 348/177, 484, 569, 185, 186, 563, 564; 345/134; H04N 17/04

[56] References Cited

U.S. PATENT DOCUMENTS

| | | | |
|---|---|---|---|
| 4,149,189 | 4/1979 | Nagai | 348/185 |
| 4,685,065 | 8/1987 | Braun et al. | 348/185 |
| 4,691,358 | 9/1987 | Bradford | 345/134 |
| 4,963,967 | 10/1990 | Orland et al. | 348/484 |
| 5,225,909 | 7/1993 | Koizumi | 348/484 |
| 5,339,110 | 8/1994 | Hava | 348/569 |

Primary Examiner—Victor R. Kostak
Attorney, Agent, or Firm—Francis I. Gray

[57] ABSTRACT

A digital audio waveform display is presented on a digital video waveform display instrument using the video waveform display circuitry. A decoder extracts embedded digital audio data from a digital video signal. The digital audio data is stored in a buffer memory. N digital audio data words, corresponding to N samples of the video data representing a video line for display, are read from the buffer memory at a video sample rate and input to the video waveform display circuitry. The video waveform display circuitry includes a digital to analog converter operating at the video sample rate and an analog video reconstruction filter which provides amplitude values for a swept display device.

7 Claims, 1 Drawing Sheet

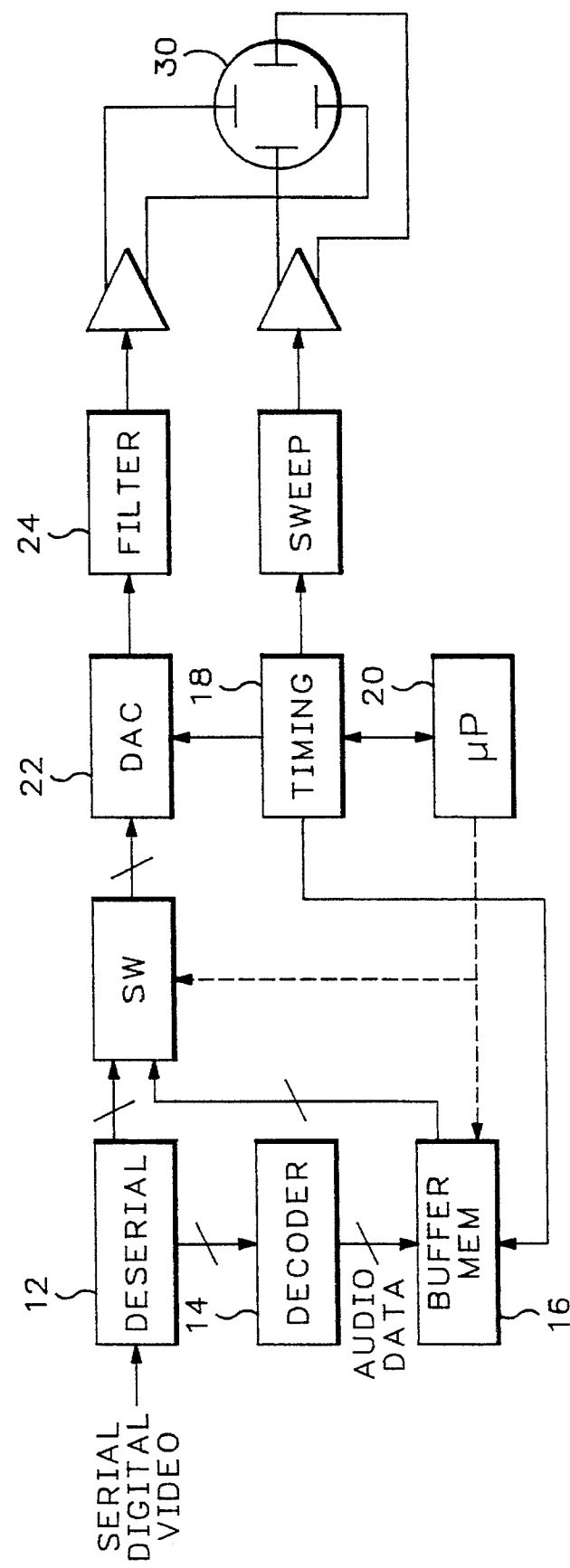

DIGITAL AUDIO WAVEFORM DISPLAY ON A VIDEO WAVEFORM DISPLAY INSTRUMENT

BACKGROUND OF THE INVENTION

The present invention relates to the display of a digital audio signal embedded within a digital video signal, and more particularly to a digital audio waveform display of the embedded digital audio signal on a video waveform display instrument using circuitry already existing in the video waveform display instrument.

Digital audio signals may be embedded in digital video signals, as described in the proposed standard SMPTE-259M, by time multiplexing audio data words into available ancillary data space within the digital video signal data words. A video signal typically is digitized into ten-bit digital words. For composite video signals the video digital words representing a horizontal sync tip provide available space for inserting ancillary data. Typically four data words of a timing reference signal (TRS) and an identification number (ID) are inserted at the beginning of the horizontal sync tip in lieu of the video digital words, followed by 55 ancillary data words. The audio data words are inserted as the ancillary data words for each active horizontal line at the same time that TRS-ID is inserted. This provides a somewhat limited four channel capacity, which is a good match for current digital video tape recorders that record four channels of digital audio. Considerably more ancillary data space is available in component video, where only the active picture portion of the analog component video signal is digitized into digital video data words. The digital data words not carrying active video provide available space for inserting ancillary data, i.e., the space between the End of Active Video signal (EAV) and the Start of Active Video signal (SAV) between video lines of data. This provides room for 16 channels of audio data and more data of other types.

There is equipment available for displaying the video waveform content of the digital video signal, such as the 1730 D Series of Digital Waveform Monitors manufactured by Tektronix, Inc. of Wilsonville, Oreg., United States of America, but such equipment does not display the audio waveform content of any embedded audio signals. To provide a waveform display of the embedded audio signals would conventionally require separate equipment to extract and decode the digital audio signal with circuitry intended for decoding audio, and using this signal for display at audio rates with appropriate audio filtering.

What is needed is an inexpensive method for displaying the waveform content of digital audio data which is embedded in digital video signals using existing video waveform display circuitry.

SUMMARY OF THE INVENTION

Accordingly the present invention provides a digital audio waveform display on a digital video waveform display instrument using existing video waveform display circuitry. Digital audio data embedded in a digital video signal are extracted from digital video data intermittently as received and stored in a buffer memory. The digital audio data is read continuously from the buffer memory at a video sample rate and input to the existing video waveform display circuitry in lieu of digital video data. The output from the video waveform display circuitry is a digital audio waveform display.

The objects, advantages and other novel features of the present invention are apparent from the following detailed description when read in conjunction with the appended claims and attached drawing.

BRIEF DESCRIPTION OF THE DRAWINGS

The Figure is a block diagram view of a video waveform display instrument for displaying embedded digital audio waveform signals according to the present invention.

DESCRIPTION OF THE PREFERRED EMBODIMENT

Referring now to the FIGURE a serial digital video signal with embedded digital audio data is input to a deserializer circuit 12 that converts the serial digital signal to parallel digital data words. The parallel digital data words are input to a decoder 14, and the decoder extracts the digital audio data. The digital audio data is stored in a buffer memory 16 in spurts at the video rate. Since the audio sample rate, typically on the order of 48 KHz, is much less than the video sample rate, only a few audio data words are available as ancillary data for each video line. A timing circuit 18, controlled by a microprocessor 20, generates a sweep signal for the X direction of an analog X-Y display device 30. A digital to analog converter (DAC) 22 receives a digital signal at the video sample rate, which is commonly in the range of 13–18 MHz, and converts it to an analog signal in response to timing signals from the timing circuit 18. The analog signal is input to an analog video reconstruction filter 24, and the reconstructed analog signal is applied to the Y direction of the analog X-Y display device. The resulting display on the X-Y display device is a waveform for the reconstructed analog signal.

A switch SW, which may be in the form of a multiplexer, has two inputs, one coupled to receive the parallel digital data words from the deserializer circuit 12 and the other coupled to receive the digital audio data words from the buffer memory 16, and an output coupled to the input of the DAC 22. The switch SW is controlled by the microprocessor 20 to replace the video data words input to the DAC 22 with audio data words for display during the active display period of each video line so that on the display the audio data appears as an audio waveform display. The timing circuit 18 provides the readout timing from the buffer memory 16 at the video sample rate. Since the audio data is read from the buffer memory 16 at the video sample rate, the DAC 22 and reconstruction filter 24 are properly matched to the signal so that no special interpolation filters are necessary to avoid aliasing effects.

The buffer memory 16 is constantly being filled and updated at the relatively low effective audio sample rate, typically at 48 KHz. A first method for reading the audio data from the buffer memory 16 at the high video sample rate is to read N audio samples from the buffer memory for the active display portion of each video line to replace corresponding N video samples. Audio samples X through X+(N−1) are read out for each video line until audio samples X+N through X+(2*N−1) are filled in the buffer memory 16. Then samples X+N through X+(2*N−1) are read out for each video line while the next N audio samples are filled in the buffer memory 16. The buffer memory 16 may be a wraparound memory so that when the memory is filled the oldest samples are then overwritten with new audio data.

A second method for reading the audio data from the buffer memory 16 that produces less flicker increases the rate at which the position of the portion of the buffer memory being read out for each video line is adjusted. This adjustment may be as often as once per video line, and results in a display that most closely resembles an oscilloscope display of the audio waveform that is triggered at the video line rate. If an average of L audio samples are filled in the buffer memory 16 during each video line, and during the first of a sequence of video lines the audio samples X through X+(N−1) are read out, then during the next successive video line the audio samples X+L through X+(N−1)+L are read out for display. For each successive video line an average of L audio samples are discarded from the audio data being displayed and an equal number of new audio samples are added to the sequence of audio data being displayed.

A third method for reading out the audio data at the video sample rate is to record a list of audio data samples that represent significant events in the audio data, such as maxima, minima or zero crossings (positive or negative). As the position of the audio data being read out from the buffer memory 16 is adjusted during every video line, as discussed above with respect to the second method, the position of the portion read out is further adjusted to coincide with the position of a nearby located audio sample from the list, simulating the action of a level sensitive sweep trigger on a conventional oscilloscope. This method most closely simulates the oscilloscope display of the audio waveform which is triggered by the audio waveform itself.

For stereo audio where two separate audio signals, left and right, are embedded in the digital video signal, the buffer memory 16 may be divided into two buffers, one for each audio signal. The microprocessor 20 controls the write of the digital audio data words from the decoder 14 into the buffer memory 16 by alternating between the two buffers for consecutive data words. With two buffers a simultaneous display of two audio waveforms may be achieved. For many composite video waveform display instruments a two-video-line display is normally available as a display mode. By alternating between the two audio data buffers in the buffer memory 16 on readout on consecutive video lines, the two-line display displays simultaneously and separately the contents of both of the audio sample buffers. For component monitors where there are three channels of video data, i.e., Y, R-Y and B-Y, the outputs from the two audio sample buffers may be displayed simultaneously on the two color difference channels. In this case there is no need to alternate between the two audio sample buffers on consecutive video lines.

Thus the present invention provides a digital audio waveform display on a video waveform display instrument using the video display circuitry of the instrument by reading in the audio data from the input video signal into a buffer memory intermittently as received, and replacing the video signal for display with the audio data from the buffer memory read out at a video sample rate.

What is claimed is:

1. A method of displaying digital audio data, which is embedded in a digital video signal, on a video waveform display instrument comprising the steps of:

extracting the digital audio data from the digital video signal;

storing the extracted digital audio data in a buffer memory as received; and replacing a video display portion of each video line of the digital video signal with the extracted digital audio data read out from the buffer memory at a video sample rate so that the extracted digital audio data is displayed as an audio waveform on the video waveform display instrument.

2. The method of claim 1 wherein the replacing step comprises the steps of:

reading out a first set of N audio samples from the extracted digital audio data in the buffer memory at the video sample rate to replace N video samples for the video display portion of each video line;

filling the buffer memory with a second set of N audio samples from the extracted digital audio data; and repeating the reading out step for the second set of N audio samples.

3. The method of claim 1 wherein the replacing step comprises the steps of:

reading out a set of N audio samples from the extracted digital audio data in the buffer memory at the video sample rate to replace N video samples for the video display portion of each video line;

filling the buffer memory with L audio samples from the extracted digital audio data during a predetermined interval;

replacing L audio samples of the set of N audio samples with the L audio samples from the buffer memory; and repeating the reading out, filling and replacing steps.

4. The method of claim 1 wherein the replacing step comprises the steps of:

reading out a set of N audio samples from the extracted digital audio data in the buffer memory at the video sample rate to replace N video samples for the video display portion of each video line;

filling the buffer memory with L audio samples from the extracted digital audio data during a predetermined interval;

listing those audio samples that have a desired characteristic trait;

replacing up to L of the audio samples in the set of N audio samples such that the first audio sample in the set of N audio samples is an audio sample identified in the listing step;

repeating the reading out, filling, listing and replacing steps.

5. An apparatus for displaying a digital audio waveform on a digital video waveform display instrument comprising:

means for extracting audio data representing the digital audio waveform from digital video data representing a video waveform, the digital audio data being embedded within the digital video data;

means for storing the digital audio data from the extracting means;

means for reading out the digital audio data from the storing means at a video sample rate;

means for displaying the digital audio data from the storing means provided by the reading out means as the digital audio waveform using display circuitry for displaying the digital video waveform.

6. The apparatus as recited in claim 5 wherein the reading out means comprises:

a timing circuit for generating the video sample rate;

a processor for accessing the storing means at the video sample rate to read out the digital audio data from the storing means and for generating a selection signal; and means for replacing in response to the selection signal digital video data with the digital audio data from the storing means for input to the displaying means.

7. The apparatus as recited in claim 5 wherein the displaying means comprises:

means for converting digital data to an analog signal;

means for reconstructive filtering the analog signal from the converting means; and means for activating a display device to present the analog signal from the reconstructive filtering means as a waveform display, the waveform display being the digital audio waveform when the digital data is the digital audio data from the storing means.

* * * * *